(12) United States Patent
Furutani et al.

(10) Patent No.: US 8,772,648 B2
(45) Date of Patent: Jul. 8, 2014

(54) METHOD FOR MANUFACTURING PRINTED WIRING BOARD AND PRINTED WIRING BOARD

(75) Inventors: Toshiki Furutani, Ogaki (JP); Takeshi Furusawa, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 13/442,921

(22) Filed: Apr. 10, 2012

(65) Prior Publication Data

US 2012/0199389 A1   Aug. 9, 2012

Related U.S. Application Data

(62) Division of application No. 12/533,454, filed on Jul. 31, 2009, now Pat. No. 8,365,402.

(60) Provisional application No. 61/101,361, filed on Sep. 30, 2008.

(51) Int. Cl.
  *H05K 1/11*   (2006.01)
(52) U.S. Cl.
  CPC ..................................... *H05K 1/113* (2013.01)
  USPC .......................................... 174/264; 174/260
(58) Field of Classification Search
  CPC ............................... H05K 1/113; H05K 1/181
  USPC ................. 174/264–265, 260, 262, 263, 266; 361/792–795
  See application file for complete search history.

(56) References Cited

U.S. PATENT DOCUMENTS

| 7,297,562 | B1 | 11/2007 | Huemoeller et al. |
| 7,707,715 | B2 * | 5/2010 | Okabe et al. ..................... 29/846 |
| 2007/0074902 | A1 | 4/2007 | Hirata |
| 2008/0251494 | A1 * | 10/2008 | Park et al. ........................ 216/13 |
| 2009/0011220 | A1 | 1/2009 | Park et al. |
| 2009/0199399 | A1 | 8/2009 | Kariya et al. |
| 2009/0242255 | A1 | 10/2009 | Taniguchi et al. |

FOREIGN PATENT DOCUMENTS

| JP | 2004-179540 | 6/2004 |
| JP | 2005-039233 | 2/2005 |
| JP | 3619421 | 2/2005 |
| JP | 3671986 | 7/2005 |
| JP | 2006-41029 | 2/2006 |
| JP | 2007-266316 | 10/2007 |
| JP | 2007-317823 | 12/2007 |
| JP | 2008-263188 | 10/2008 |
| JP | 2009-16802 | 1/2009 |
| KR | 10-0857165 | 9/2008 |

\* cited by examiner

*Primary Examiner* — Jeremy C Norris
(74) *Attorney, Agent, or Firm* — Oblon, Spivak, McClelland, Maier & Neustadt, L.L.P.

(57) ABSTRACT

A method for manufacturing a printed wiring board, in which filled vias with a reduction in faulty connections are formed, and providing such a printed wiring board. After an electroless plated film is formed on an inner wall of a via opening, electrolytic plating is performed on insulative resin base material; the via opening is filled with plating metal and a filled via is formed. Therefore, during electrolytic plating, a plating metal is deposited from electroless plated film on the side wall of the via opening as well as from the bottom of the via opening. As a result, the via opening may be completely filled through electrolytic plating, forming a filled via with a reduction in faulty connections.

14 Claims, 7 Drawing Sheets

METHOD FOR MANUFACTURING PRINTED WIRING BOARD AND PRINTED WIRING BOARD

CROSS-REFERENCE TO RELATED APPLICATIONS

The present application is a divisional of and claims the benefit of priority to U.S. application Ser. No. 12/533,454, filed on Jul. 31, 2009 which is based on and claims the benefit of priority to U.S. Application No. 61/101,361, filed Sep. 30, 2008. The contents of these applications are incorporated herein by reference in their entirety.

TECHNICAL FIELD

The present invention is related to a printed wiring board and its manufacturing method, where the front layer and the back layer of insulative resin layers are connected through filled vias. Especially, the present invention is related to a printed wiring board and its manufacturing method, which can be preferably used for a printed wiring board where conductive circuits are transferred to an insulative resin layer through a transfer process.

BACKGROUND OF THE INVENTION

As for a method to carry out interlayer connection in a printed wiring board, vias are more often used than throughholes due to a demand that requires compact-type electronic devices. Furthermore, due to demand for fine pitch in a printed wiring board, a transfer method to form a conductive circuit, in which a conductive circuit formed on a transfer base is transferred to an insulative resin layer, is being put into practice. For example, U.S. Pat. No. 7,297,562 B1 and Japanese Laid-Open Patent Publication 2005-39233 disclose a method for manufacturing a printed wiring board using a transfer process. The entire contents of these patent publications are incorporated herein by reference. According to these patent publications, conductive circuits are embedded in an insulative material through a transfer process, and via openings are formed at predetermined spots. Then, filled vias are formed in the via openings by bottom-up plating.

However, while plating, the speed of depositing a plating metal may easily become erratic. When performing bottom-up plating, the conductive circuit at the bottom portions of via openings is connected to electricity so that the metal will be deposited from their bottoms. If the deposited metal comes in contact with a conductive circuit adjacent to the top portion of a via opening, electric current starts flowing to that conductive circuit. Namely, when multiple filled vias are formed simultaneously, if the speed in depositing the plating metal is faster in some via openings and the deposited metal comes in contact with the conductive circuit adjacent to the top portions of such via openings, electric current starts flowing into that conductive circuit. Accordingly, electric current flows mainly in the conductive circuit adjacent to the top portions of the via openings, and the current flowing in the conductive circuit at the bottom portions of the via openings decreases. That is because the surface size of the conductive circuit at the bottom portions of the via openings is smaller than the surface size of the conductive circuit adjacent to the top portions of the via openings. As a result, in the via openings where the deposition speed of the plating metal is slow, the plated metal is suppressed from further deposition, thus making it difficult for the deposited plating metal to reach the conductive circuit adjacent to the top portions of such via openings. Therefore, at the via openings where deposition of the plating metal is slow, conduction may become incomplete, causing faulty connections.

BRIEF SUMMARY OF THE EMBODIMENTS OF THE INVENTION

A method for manufacturing a printed wiring board according to an example embodiment of the present invention has the following technical features: forming a substrate by preparing an insulative resin base material having a first surface and a second surface opposite the first surface; embedding respective conductive circuits in the first surface and in the second surface of the insulative resin base material; forming a via opening that reaches from either the first surface or the second surface to the conductive circuit embedded in the other of the first or second surface; forming an electroless plated film on an inner wall of the via opening by performing electroless plating on the substrate; and forming a filled via by performing electrolytic plating on the substrate and filling metal in the via opening having the electroless plated film formed on the inner wall of the via opening.

Also, a printed wiring board of the present invention includes: an insulative resin base material having a first surface and a second surface opposite the first surface; conductive circuits embedded in the first surface and the second surface of the insulative resin base material; and a filled via made up of an electroless plated film formed on an inner wall of a via opening that reaches from either the first surface or the second surface to the conductive circuit embedded in the other of the first or second surface, and formed of an electrolytic plated film filled in the via opening having the electroless plated film.

DETAILED DESCRIPTION OF THE PREFERRED EMBODIMENTS

Figure 1:
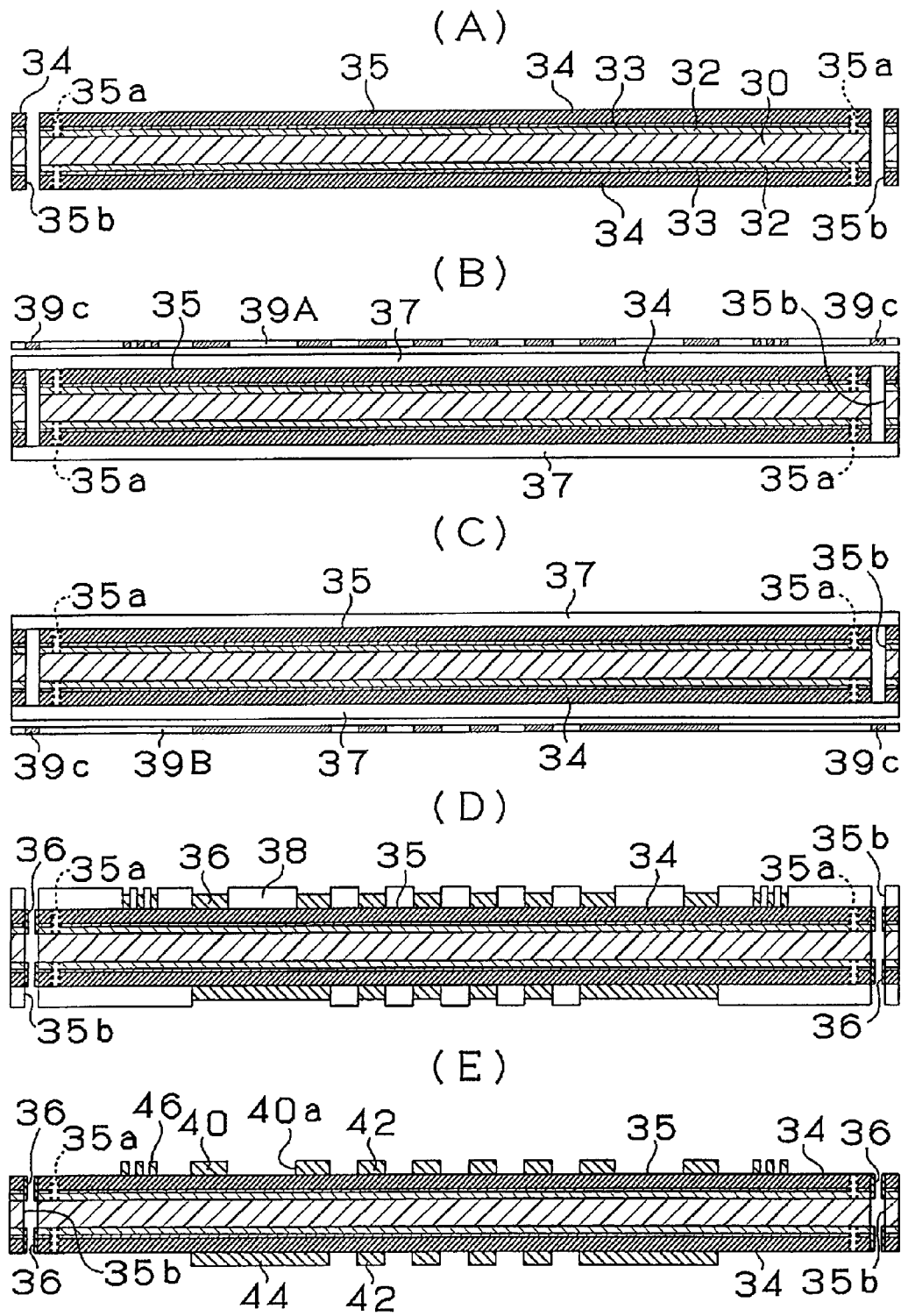
FIGS. 1 (A)-(E) are views showing steps of a method for manufacturing a printed wiring board according to the First Embodiment of the present invention.

The embodiments will now be described with reference to the accompanying drawings, wherein like reference numerals designate corresponding to identical elements throughout the various drawings.

In the present invention, after forming an electroless plated film on the inner walls of via openings by performing electroless plating on the substrate, electrolytic plating is performed on the substrate to fill metal in the via openings, thus forming filled vias. Therefore, plating is deposited from the electroless plated film on the side walls of the via openings as well as from the bottom of the via openings. As a result, the via openings may be completely filled through electrolytic plating, forming filled vias with a reduction in faulty connections.

First Embodiment

The structure of printed wiring board (10) according to the First Embodiment of the present invention is described with reference to FIGS. (1-5).

FIG. (5C) is a cross-sectional view of printed wiring board (10). FIG. (5D) shows a phase in which the top and bottom of printed wiring board (10) shown in FIG. (5C) are inverted, and an IC chip (90) as an electronic component is mounted on wiring board (10), which is installed on daughterboard (94). As shown in FIG. (5C), conductive circuits (42) are embedded in the upper surface as the first surface of insulative resin base material (56), as well as in the lower surface as the second surface opposite the first surface. First via lands (40) embedded in the upper surface of insulative resin base material (56) and second via lands (44) embedded in the lower surface of base material (56) are connected through filled vias (68). Solder resists (70) are formed on the upper and lower surfaces of insulative resin base material (56). In openings (70a) of solder resists (70), solder bumps (76U, 76D) are arranged. As shown in FIG. (5D), the printed wiring board (10) and pads (92) of the IC chip (90) are connected through solder bumps (76U); and wiring board (10) and pads (96) of daughterboard (94) are connected through solder bumps (76D). Although not shown in the drawings, the printed wiring board (10) and IC chip (90) are molded with resin.

A method for manufacturing a printed wiring board according to the First Embodiment is described with reference to FIGS. (1-5).

(1) A transfer laminate (35) is prepared by laminating copper foil (32) as a conductive foil, removal layer (33) and transfer base (34) in that order on both surfaces of insulative resin layer (30) (FIG. 1(A)). The periphery of each transfer base (34) is welded to copper foil (32) through ultrasonic treatment. Guide holes (35b) as alignment marks are formed outside the ultrasonic welded parts (35a) and penetrate transfer laminate (35).

(2) Plating resist (38) with a predetermined pattern is formed according to guide holes (35b) of transfer base (34) on both surfaces of transfer laminate (35). Specifically, photosensitive dry film (37) is laminated on transfer base (34) positioned on both surfaces of transfer laminate (35). Furthermore, mask (39A) is arranged on the upper surface of transfer laminate (35), which is then exposed to light (FIG. 1(B)). Photosensitive dry film (37) and mask (39A) are set apart from each other. Mask (39A) has a black pattern corresponding to conductive circuit (42) with first via lands (40) and alignment marks (46). Furthermore, mask (39A) has alignment marks (39c) corresponding to guide holes (35b) of transfer laminate (35). When arranging mask (39A), the positions of guide holes (35b) and alignment marks (39c) are aligned.

After mask (39A) is removed, mask (39B) is arranged on the lower surface of transfer laminate (35), which is then exposed to light (FIG. 1(C)). Photosensitive dry film (37) and mask (39B) are set apart from each other. Mask (39B) has a black pattern corresponding to conductive circuit (42) with second via lands (44). Moreover, mask (39B) has alignment marks (39c) corresponding to guide holes (35b) of transfer laminate (35). When arranging mask (39B), the positions of guide holes (35b) and alignment marks (39c) are aligned.

After mask (39B) is removed, a development process is carried out to form plating resist (38) on both surfaces of transfer laminate (35). Then, electrolytic plating is performed to form electrolytic plated film (36) on each transfer base (34) (FIG. 1(D)).

(3) By removing plating resist (38), conductive circuit (42) with first via lands (40) and alignment marks (46) are formed on transfer base (34) for the upper surface of insulative resin base material (56). At the same time, conductive circuit (42) with second via lands (44) is formed on transfer base (34) for the lower surface of insulative resin base material (56) (FIG. 1(E)). Alignment mark (46) is made up of a circle and a dot in the center of the circle; first via land (40) has opening (40a); and second via land (44) is configured to be a plate.

Figure 2:
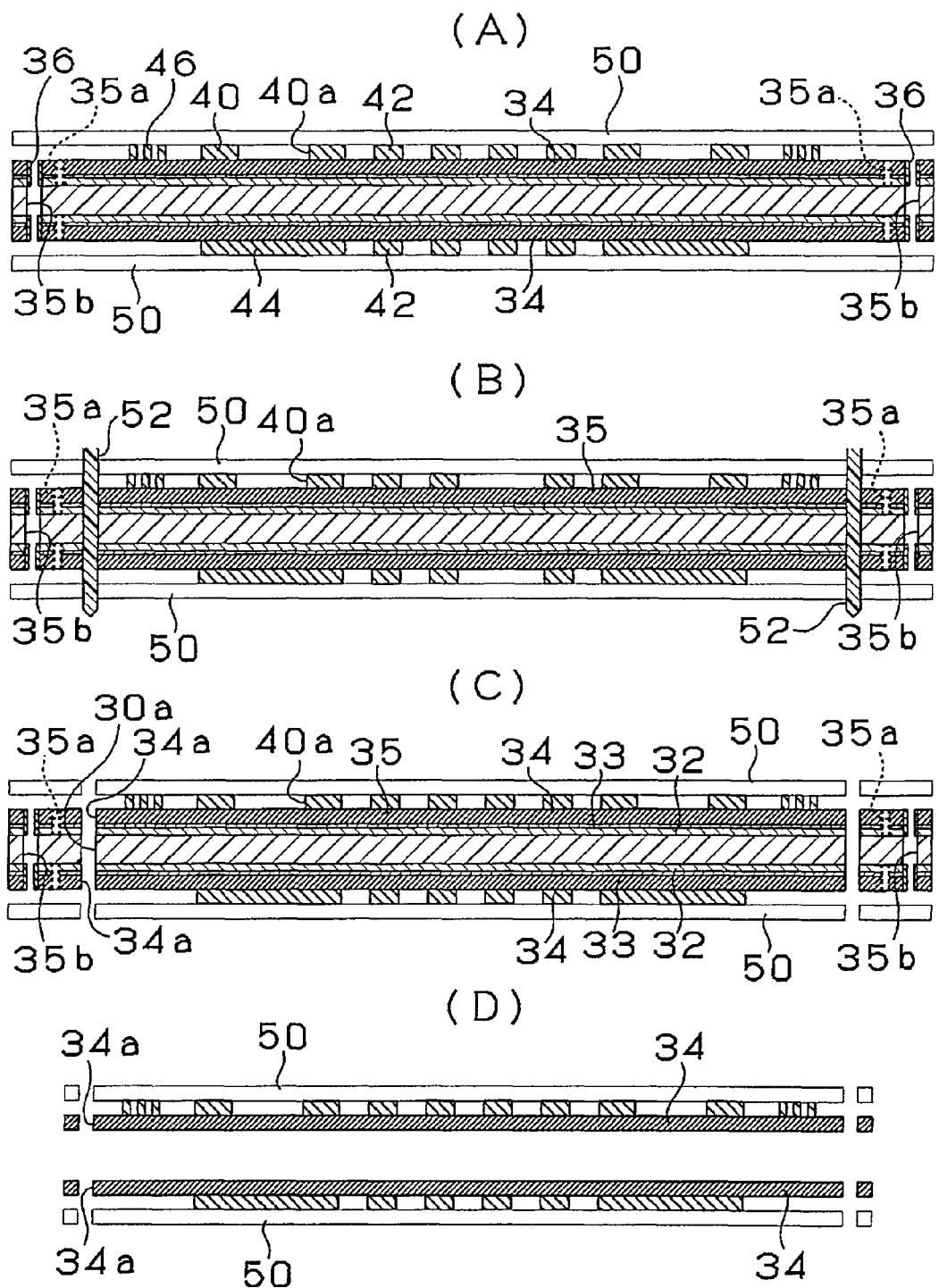
FIGS. 2 (A)-(D) are cross-sectional views showing steps of a method for manufacturing a printed wiring board according to the First Embodiment.

(4) Conductive circuit (42) on each transfer base (34) is covered with protective layer (50) (FIG. 2(A)).

(5) Holes are formed in transfer laminate (35) using drill (52) (FIG. 2(B)). Holes are formed by drill (52) inside ultrasonic welded parts (35a) of transfer laminate (35). Holes are made up of guide holes (34a) which penetrate each transfer base (34), and of holes (30a) which penetrate insulative resin layer (30), copper foils (32) and removal layers (33) (FIG. 2(C)).

(6) By cutting transfer laminate (35) between ultrasonic welded parts (35a) and guide holes (34a) of each transfer base (34), transfer bases (34) are removed from transfer laminate (35) (FIG. 2(D)). During that time, transfer bases (34) may be easily removed because of removal layers (33).

Figure 3:
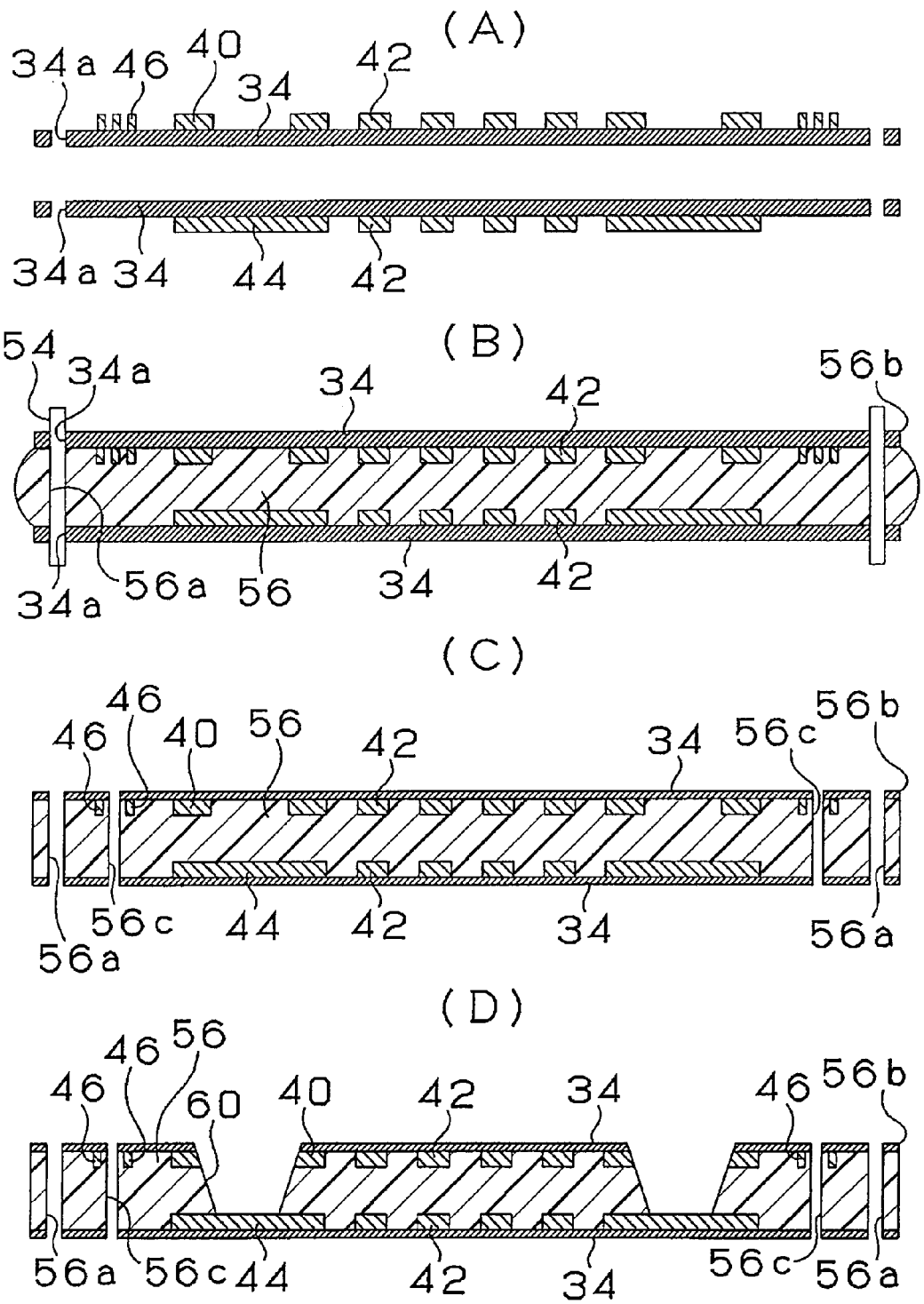
FIGS. 3 (A)-(D) are cross-sectional views showing steps of a method for manufacturing a printed wiring board according to the First Embodiment.

(7) Protective layers (50) are removed from transfer bases (34) (FIG. 3(A)). Also, insulative resin base material (56) made of prepreg is prepared. After its top and bottom are inverted, each transfer base (34) is laminated on both the upper and the lower surfaces of insulative resin base material (56) respectively. Then, transfer base (34) is pressed onto the upper and lower surfaces of insulative resin base material (56) so that conductive circuit (42) on each transfer base (34) will be embedded in insulative resin base material (56). Accordingly, substrate (56b) is formed (FIG. 3(B)). Before laminating transfer bases (34), guide holes (56a) corresponding to guide holes (34a) of each transfer base (34) are formed in advance in insulative resin base material (56). Then, when laminating transfer bases (34), alignment pin (54) is inserted in each guide hole (34a) and guide hole (56a) corresponding to guide hole (34a) to align conductive circuit (42) formed on each transfer base (34). After substrate (56b) is formed, alignment pins (54) are removed. Then, the periphery of substrate (56b) is trimmed to remove the resin bulging from substrate (56b) (not shown in the drawings).

(8) The thickness of each transfer base (34) is reduced by soft etching. After soft etching, the positions of alignment marks (46) are verified from outside by projecting X-rays, and holes (56c) which penetrate marks (46) are formed in substrate (56b) (FIG. 3(C)). Then, black oxide treatment is conducted on the surfaces of transfer bases (34).

(9) Based on holes (56c), via openings (60) which reach second via lands (44) from the upper surface of base material (56) are formed through laser processing in insulative resin base material (56) (FIG. 3(D)). Openings (40a) of first via lands (40) correspond to via openings (60). Via lands (40) are used as a mask to form via openings (60) through laser processing.

(10) A drug-solution treatment to apply palladium nuclei on the surface of each transfer base (34) is conducted as a preliminary treatment for electroless plating. Then, electroless plated film (62) is formed on the inner walls of via openings (60) through electroless plating (FIG. 4(A)). Electroless plated film (62) is also formed on the surface of each transfer base (34).

Figure 4:
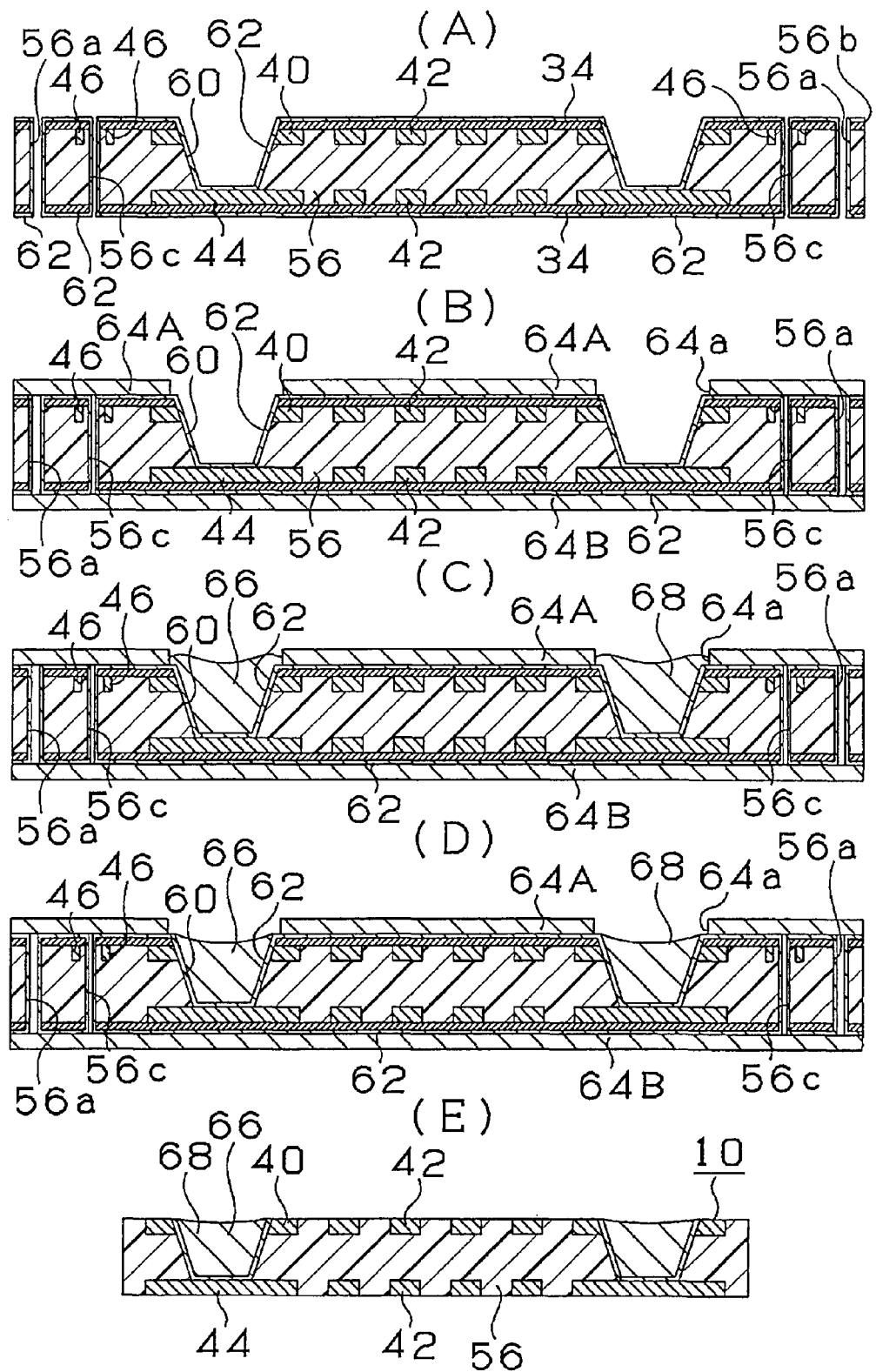
FIGS. 4 (A)-(E) are cross-sectional views showing steps of a method for manufacturing a printed wiring board according to the First Embodiment.

(11) Plating resist (64A) with openings (64a) that correspond to via openings (60) is formed on the upper surface of substrate (56b), and plating resist (64B) is formed on the lower surface of substrate (56b) (FIG. 4(B)). Openings (64a) of plating resist (64A) are made larger than via openings (60).

(12) Electrolytic plated film (66) is formed in via openings (60) through electrolytic plating, and filled vias (68) are formed (FIG. 4(C)). During that time, since openings (64a) of plating resist (64A) are larger than via openings (60), electrolytic plated film (66) is also formed on electroless plated film (62) exposed between openings (64a) and via openings (60). Accordingly, bulging portions of filled vias (68) are formed, protruding upward from a planar surface that is the same level as the exposed portions of electroless plated film (62).

(13) The surfaces of filled vias (68) are etched to remove the bulging portions (FIG. 4(D)).

(14) After plating resists (64A, 64B) are removed, each transfer base (34) is removed by soft etching. Substrate (56b) is cut inside the region where alignment marks (46) are positioned, and printed wiring board (10) is formed (FIG. 4(E)). At that time, the surfaces of filled vias (68) and the surface of insulative resin base material (56) are positioned substantially on the same level.

Figure 5:
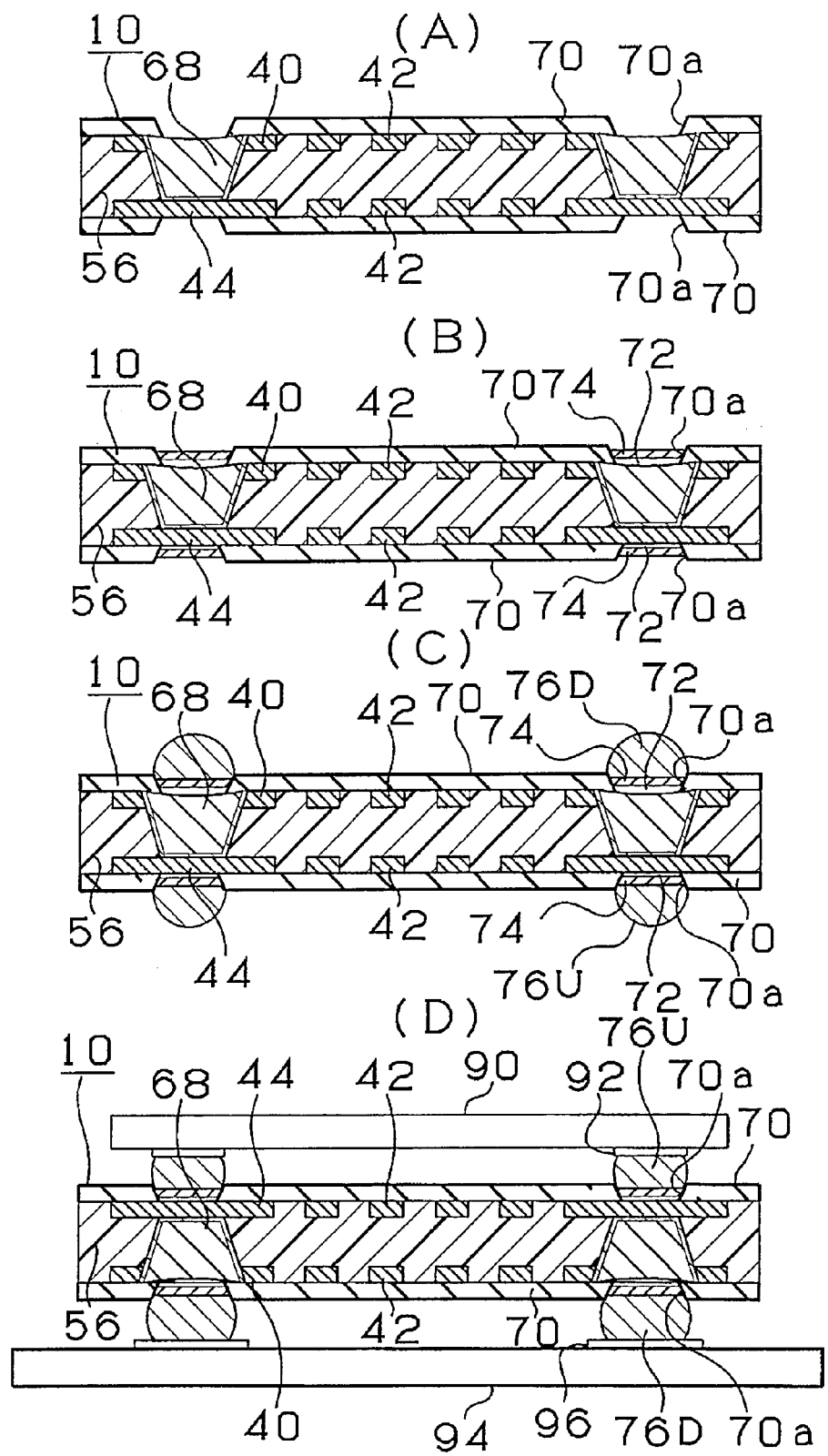
FIGS. 5 (A)-(D) are cross-sectional views showing steps of a method for manufacturing a printed wiring board according to the First Embodiment.

(15) On the upper surface and lower surface of printed wiring board (10), solder resist layers (70) with predetermined openings (70a) are formed (FIG. 5(A)).

(16) In openings (70a) of solder resist layers (70), a corrosion-resistant layer made up of nickel-plated film (72) and gold plated film (74) is formed (FIG. 5(B)).

(17) In openings (70a) of solder resist layers (70), solder paste is printed to form solder bumps (76U, 76D) through soldering reflow (FIG. 5(C)).

(18) After the top and the bottom of printed wiring board (10) are inverted, IC chip (90) is mounted on printed wiring board (10) through solder bumps (76U), and printed wiring board (10) is installed on daughterboard (94) through solder bumps (76D) (FIG. 5(D)).

In the First Embodiment, electroless plating is performed on insulative resin base material (56) to form electroless plated film (62) on the inner walls of via openings (60). Then, by performing electrolytic plating on the insulative resin base material (56), via openings (60) are filled with a plated metal, and filled vias (68) are formed. Namely, filled vias (68) are made up of electroless plated film (62) formed on the inner walls of via openings (60) and of electrolytic plated film (66) formed on electroless plated film (62). Accordingly, during the electrolytic plating, the plating metal will be deposited from the bottoms of via openings (60) as well as from electroless plated film (62) on the side walls of via openings (60). As a result, via openings (60) may be completely filled through electrolytic plating, forming filled vias (68) free of faulty connections between second via lands (44) and first via lands (40).

In the First Embodiment, conductive circuit (42) is formed on each transfer base (34) of transfer laminate (35). Therefore, conductive circuit (42) for the upper surface of insulative resin base material (56) and conductive circuit (42) for the lower surface may be simultaneously formed. As a result, the thickness and composition of conductive circuits (42) embedded in the upper and lower surfaces of insulative resin base material (56) may be made identical to each other. Thus, the reliability of conductive circuits (42) may be enhanced.

Furthermore, by forming transfer laminate (35) with insulative resin layer (30), copper foils (32), removal layers (33) and transfer bases (34), laminate (35) may be made thick. Accordingly, laminate (35) may be conveyed by supporting only an end surface of transfer laminate (35), thus preventing conductive circuits (42) on transfer bases (34) from touching, for example, conveyor rollers to protect conductive circuits (42).

In the First Embodiment, protective layer (50) is laminated on conductive circuit (42) of each transfer base (34). Then, after a step to remove transfer bases (34) from transfer laminate (35), protective layer (50) is removed from each transfer base (34). By protecting conductive circuit (42) with protective layer (50), when guide holes (34a) are formed in each transfer base (34) using, for example, drill (52), potential damage to conductive circuit (42) will be reduced and thus the reliability of conductive circuit (42) may be enhanced.

Furthermore, since protective layer (50) supports transfer base (34), during and after the removal of transfer base (34) from transfer laminate (35), it may prevent thin transfer base (34) from warping or curling, thus protecting conductive circuit (42) on transfer base (34).

In the First Embodiment, plating resists (38) are formed based on guide holes (35b) of transfer laminate (35). In doing so, conductive circuit (42) formed on each transfer base (34) may be aligned with each other, and the positional accuracy of conductive circuits (42) may be enhanced.

Furthermore, after forming conductive circuit (42) on each transfer base (34) of transfer laminate (35), guide holes (34a) which penetrate each transfer base (34) are formed. Then, by inserting alignment pins (54) in guide holes (34a) formed in each transfer base (34), conductive circuit (42) formed on each transfer base (34) is aligned. Guide holes (34a) are formed after conductive circuits (42) on their respective transfer bases (34) are aligned with each other. Therefore, guide holes (34a) may be positioned accurately. As a result, the position of conductive circuit (42) embedded in the lower surface of insulative resin base material (56) will not shift relative to the position of conductive circuit (42) embedded in the upper surface of insulative resin base material (56). Accordingly, conductive circuits (42) may be positioned accurately.

Moreover, by forming a hole which penetrates transfer laminate (35), guide holes (34a) may be formed simultaneously in each transfer base (34). Therefore, each guide hole (34a) may be positioned accurately, thus aligning conductive circuits (42) even more precisely.

In the First Embodiment, alignment marks (46) are formed in transfer base (34). Accordingly, via openings (60) may be formed based on alignment marks (46), and the positional accuracy of via openings (60) may be enhanced.

In the First Embodiment, after the step to form electroless plated film (62), plating resists (64A, 64B) for electrolytic plating are formed respectively on transfer bases (34). Then, after the step to form filled vias (68) through electrolytic plating, transfer bases (34) are removed along with plating resists (64A, 64B). Through a drug-solution treatment conducted prior to electroless plating, palladium nuclei or the like remain on the surface of each transfer base (34). However, by removing transfer bases (34) after electrolytic plating, palladium nuclei will not remain on the surfaces of insulative resin base material (56), and the reliability of printed wiring board (10) may increase.

In the First Embodiment, after the step to form filled vias (68) through electrolytic plating and prior to the step to remove plating resist (64A), etching is conducted on the surfaces of filled vias (68). Namely, etching is conducted on the surfaces of filled vias (68) while plating resist (64A) remains on transfer base (34). Therefore, the bulging portions of filed vias (68) are removed selectively, thus the flatness features on the surfaces of filled vias (68) may be improved.

In the First Embodiment, via openings (60) are formed using first via lands (40) as a mask through laser processing. Thus, the positional accuracy of via openings (60) may be enhanced.

In the First Embodiment, IC chip (90) is mounted on the surface of printed wiring board (10) where second via lands (44) are embedded. Namely, in printed wiring board (10), the surface where second via lands (44) are embedded is the mounting surface for IC chip (90). In printed wiring board (10), the surface where second via lands (44) are embedded has higher flatness features than the surface where first via lands (40) are embedded. That is because the center of the surface of filled via (68) is slightly recessed due to etching. Since IC chip (90) is mounted on a surface with higher flatness features, printed wiring board (10) with mounted IC chip (90) may be made more reliable.

Second Embodiment

A method for manufacturing a printed wiring board according to the Second Embodiment is described with reference to FIG. (6).

Figure 6:
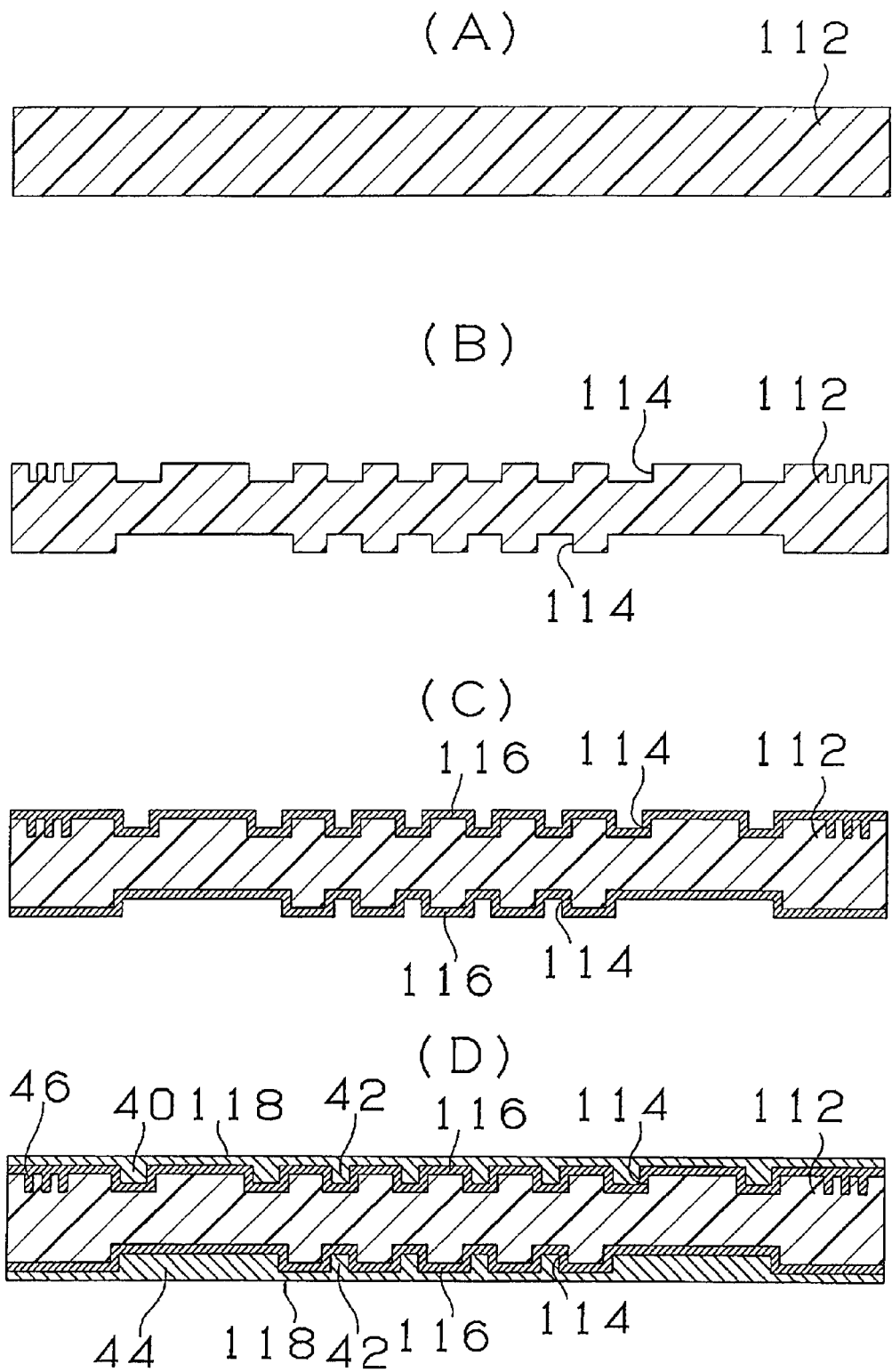
FIGS. 6 (A)-(D) are cross-sectional views showing steps of a method for manufacturing a printed wiring board according to the Second Embodiment of the present invention.

On the surfaces of insulative resin base material (112) shown in FIG. 6(A), recessed portions (114) are formed through laser processing so as to correspond to conductive circuits and alignment marks (FIG. 6(B)). Next, a plating metal is filled in recessed portions (114) to form conductive circuits (42) and alignment marks (46). Specifically, after a drug-solution treatment is conducted to apply palladium nuclei on the surfaces of insulative resin base material (112), electroless plated film (116) is formed on the inner walls of recessed portions (114) through electroless plating (FIG. 6(C)). During that time, electroless plated film (116) is also formed on the surfaces of insulative resin base material (112). Then, electrolytic plated film (118) is formed in recessed portions (114) through electrolytic plating to fill a plating metal in recessed portions (114). Accordingly, conductive circuits (42) having via lands (40, 44) respectively and alignment marks (46) are formed (FIG. 6(D)). During that time, electrolytic plated film (118) is also formed on the surfaces of insulative resin base material (112). Since the rest of the steps are the same as in the First Embodiment described above with reference to FIG. 3(C)-FIG. (5), their descriptions are omitted.

In the Second Embodiment, conductive circuits (42) are formed directly on the surfaces of insulative resin base material (112). Therefore, a series of the steps in the First Embodiment, namely, from the preparation of transfer laminate (35) to the transfer of conductive circuits (42) to insulative resin base material (56) (above steps (1)-(7)), may be omitted in the Second Embodiment.

However, the present invention is not limited to the structures described in each of the above embodiments; the structure of each embodiment may be modified as follows.

In the First Embodiment, insulative resin layer (30), copper foils (32) and removal layers (33) may be omitted so that while each transfer base (34) is independent of each other, conductive circuit (42) may be formed on each transfer base (34).

In the Second Embodiment, instead of forming conductive circuits (42) by using electroless plated film (116) and electrolytic plated film (118), filler containing metal particles may be filled in recessed portions (114) and then cured to form conductive circuits (42). Conductive circuits (42) may also be formed only by electroless plating.

In each embodiment, if openings (64a) of plating resist (64A) are made substantially the same size as that of via openings (60), the surfaces of filled vias (68) after electrolytic plating may be positioned on substantially the same level as the surface of substrate (56b). In such a case, etching on the surfaces of filled vias (68) may be omitted.

Figure 7:
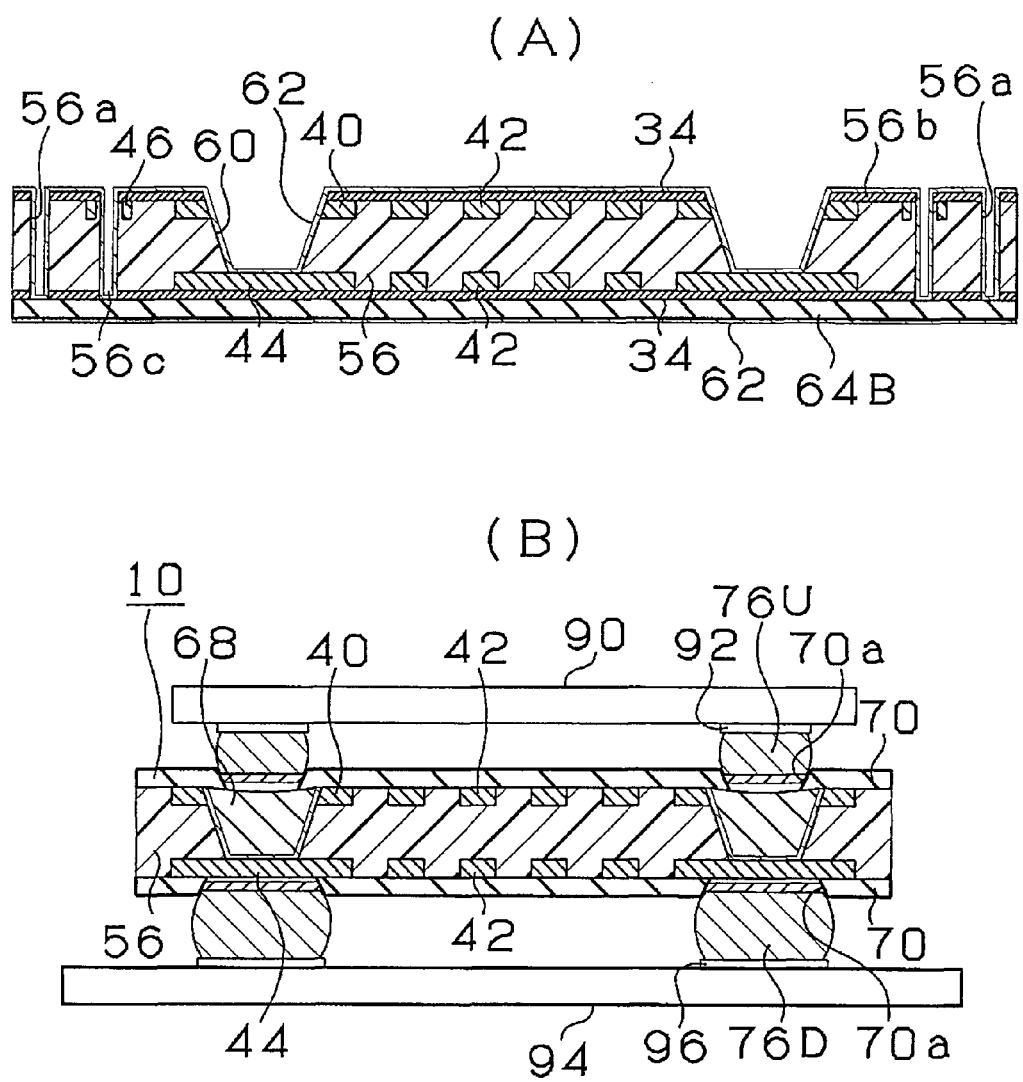
FIGS. 7 (A) and (B) are cross-sectional views showing steps of a method for manufacturing a printed wiring board according to a modified example of an embodiment of the present invention.

In each embodiment, for example, plating resist (64B) may be formed before electroless plating (FIG. 7(A)).

In each embodiment, without inverting the top and bottom of printed wiring board (10), IC chip (90) may be mounted on wiring board (10) (FIG. 7(B)). Namely, in printed wiring board (10), the surface where first via lands (40) are embedded may be used as a mounting surface for IC chip (90).

In each embodiment, alignment marks (46) may be omitted. Instead of such marks (46), via openings (60) may be formed based on conductive circuit (42) embedded in insulative resin base material (56). In addition, the regions that include alignment marks (46) do not necessarily have to be removed from substrate (56b).

EXAMPLES

In the following, the present invention is described more specifically referring to examples. However, the present invention is not limited to the scope of such examples.

(1) Transfer laminate (35) is prepared in which copper foil (32), removal layer (33) and transfer base (34) are laminated in that order on both surfaces of insulative resin layer (30) made of glass epoxy resin or BT (bismaleimide triazine) resin with a thickness of 0.2-0.8 mm (FIG. 1(A)). For example, as for transfer laminate (35), brand name MCL-E679FG (R) made by Hitachi Chemical Co., Ltd., which is formed with 5 μm-thick copper foils (32) and 18 μm-thick transfer bases (34), is prepared. In such a case, insulative resin layer (30) is thick in order to make it easy to form resist layers in a later process. The periphery of each transfer base (34) is welded to copper foil (32) by ultrasonic treatment. Ultrasonic treatment (ultrasonic welding) is conducted under the following conditions: horn amplitude: approximately 12 μm; number of horn oscillations: f=28 kHz; horn pressure: p=approximately 0-12 kgf; and horn travel speed: v=approximately 10 mm/sec. Accordingly, copper foil (32) and transfer base (34) are welded in a framed configuration. As a result, during a drug-solution treatment, the drug solution is prevented from seeping between copper foil (32) and transfer base (34) inside ultrasonic welded parts (35a). Outside ultrasonic welded parts (35a), guide holes (35b) which penetrate transfer laminate (35) are formed as alignment marks.

(2) An etching solution (brand name Cz 8101 made by Mec Co., Ltd.) is sprayed on the surface of transfer base (34) to roughen it. After that, transfer laminate (35) is washed with water and dried. Then, on transfer base (34) positioned on both surfaces of transfer laminate (35), a commercially available photosensitive dry film (37) is laminated. Furthermore, mask (39A) is placed on the upper surface of transfer laminate (35), which is then exposed to light at 100 mJ/cm2 (FIG. 1(B)). Photosensitive dry film (37) and mask (39A) are set apart from each other. Mask (39A) has a black pattern which corresponds to conductive circuit (42) with first via lands (40) and alignment marks (46). In addition, mask (39A) has alignment marks (39c) which correspond to guide holes (35b) of transfer laminate (35). When arranging mask (39A), positions of guide holes (35b) and alignment marks (39c) are aligned. To align guide holes (35b) and alignment marks (39c), for example, while light is beamed from under the lower surface of transfer laminate (35) into guide holes (35b), mask (39A) is positioned so as to block the light with alignment marks (39c).

After removing mask (39A), mask (39B) is placed on the lower surface of transfer laminate (35), which is then exposed to light at 100 mJ/cm2 (FIG. 1(C)). Photosensitive dry film (37) and mask (39B) are set apart from each other. Mask (39B) has a black pattern which corresponds to conductive circuit (42) with second via lands (44). Moreover, mask (39B) has alignment marks (39c) which correspond to guide holes (35b) of transfer laminate (35). When arranging mask (39B), positions of guide holes (35b) and alignment marks (39c) are aligned. To align guide holes (35b) and alignment marks (39c), for example, while light is beamed from over the upper surface of transfer laminate (35) into guide holes (35b), mask (39B) is positioned so as to block the light with alignment marks (39c).

After mask (39B) is removed, developing treatment is conducted using a 0.8% sodium carbonate solution to form 25 μm-thick plating resists (38) with predetermined patterns. In the following, electrolytic copper plating is performed under the following conditions to form 18 μm-thick electrolytic copper-plated film (36) on each transfer base (34) (FIG. 1(D)).

[Electrolytic Copper Plating Solution]

| | |
|---|---|
| sulfuric acid | 2.24 mol/l |
| copper sulfate | 0.26 mol/l |
| additive | 19.5 ml/l |
| (Cupracid GL, made by Atotec Japan) | |

[Electrolytic Copper Plating Conditions]

| | |
|---|---|
| current density | 1 A/dm$^2$ |
| time | 70 minutes |
| temperature | 22 ± 2° C. |

(3) By removing plating resists (38) using a solution containing 40 g/l NaOH at a solution temperature of 50° C., conductive circuit (42) with first via lands (40) and alignment marks (46) is formed on transfer base (34) for the upper surface of insulative resin base material (56). Simultaneously formed is conductive circuit (42) with second via lands (44) on transfer base (34) for the lower surface of insulative resin base material (56) (FIG. 1(E)). The thickness of each conductive circuit (42) and alignment marks (46) is 18 μm. Alignment mark (46) is made up of a circle and a dot in the center of the circle; first via land (40) has opening (40a); and second via land (44) is configured to be a circular disc. Then, an etching solution (brand name Cz 8101, made by Mec Co., Ltd.) is sprayed on conductive circuits (42) and alignment marks (46) to make roughened surfaces.

(4) Conductive circuit (42) on each transfer base (34) is covered with protective layer (50) made of resin such as PET or the like (FIG. 2(A)).

(5) Multiple holes are formed in transfer laminate (35) using drill (52) (FIG. 2(B)). Holes are formed by drill (52) inside ultrasonic welded parts (35a) of transfer laminate (35). Such holes are made up of guide holes (34a) which penetrate each transfer base (34), and of holes (30a) which penetrate insulative resin layer (30), copper foils (32) and removal layers (33) (FIG. 2(C)).

(6) Transfer laminate (35) is cut between ultrasonic welded parts (35a) and guide holes (34a) of each transfer base (34) through router processing. Accordingly, transfer bases (34) are removed from transfer laminate (35) (FIG. 2(D)).

(7) Protective layer (50) is removed from transfer base (34) (FIG. 3(A)). After its top and bottom are inverted, transfer base (34) is laminated respectively on both surfaces of insulative resin base material (56) with a thickness of 36 μm formed with double-layered prepreg (brand name GEA-679FG GSZPE, made by Hitachi Chemical Co., Ltd.) Each transfer base (34) is vacuum-pressed onto insulative resin base material (56) through vacuum pressing using vacuum laminator equipment. During that time, conductive circuit (42) on each transfer base (34) is embedded in insulative resin base material (56) to form substrate (56b) (FIG. 3(B)). Before laminating transfer bases (34), guide holes (56a) are formed in advance using a drill at predetermined spots of insulative resin base material (56) so as to correspond to guide holes (34a) of each transfer base (34). Then, when laminating transfer bases (34), alignment pin (54) is inserted in each guide hole (34a) and guide hole (56a) corresponding to guide hole (34a) to align conductive circuit (42) formed on each transfer base (34). After forming substrate (56b), alignment pins (54) are removed. Then, the periphery of substrate (56b) is trimmed to remove the resin bulging from substrate (56b) (not shown in the drawings).

(8) The thickness of each transfer base (34) is reduced to 5 μm through soft etching. For soft etching, an etching solution containing sulfuric acid and hydrogen peroxide or an etching solution containing sodium persulfate is used. After soft etching, positions of alignment marks (46) are verified from outside through X-ray projection, and holes (56c) which penetrate marks (46) are formed on substrate (56b) (FIG. 3(C)). Black oxide treatment is conducted on the surfaces of transfer bases (34) to blacken them.

(9) Based on holes (56c), via openings (60) that reach second via lands (44) from the upper surface of base material (56) are formed in insulative resin base material (56) through CO2 laser cycle processing (FIG. 3(D)). Specifically, CO2 laser is beamed on the surface of transfer base (34) using first via lands (40) as a mask to form via openings (60). The conditions of the CO2 laser cycle processing are wave length 10.4 μm, pulse width 15 μs and number of shots 5. After forming via openings (60), resin residue in via openings (60) is removed by immersing substrate (56b) in a solution containing chromic acid, permanganic acid and potassium, or using $O_2$ plasma, $CF_4$ plasma or mixed-gas plasma of $O_2$ and $CF_4$.

(10) A drug-solution treatment is performed to apply palladium catalyst (made by Atotec) on the surface of each transfer base (34). Then, electroless plated film (62) with a thickness of 0.45 μm is formed on the inner walls of via openings (60) through electroless plating (FIG. 4(A)). Specifically, electroless copper-plated film (62) is formed by immersing substrate (56b) in an electroless copper plating solution with the following composition at a solution temperature of 30° C. During that time, electroless copper plated film (62) is also formed on the surface of each transfer base (34).

[Electroless Copper Plating Solution]

| | |
|---|---|
| $CuSO_4 \cdot 5H_2O$ | 10 g/l |
| HCHO | 8 g/l |
| NaOH | 5 g/l |
| Rochelle salt | 45 g/l |
| additive | 30 ml/l |

(11) After washing with water and drying substrate (56b) with electroless copper-plated film (62), a commercially available dry film is laminated on both the upper and lower surfaces of substrate (56b). A mask is placed on each dry film, which is exposed to light at 210 mJ/cm2 and developed with a 0.8% sodium carbonate solution. Through such a series of treatments, plating resist (64A) with openings (64a) is formed on the upper surface of substrate (56b), and plating resist (64B) is formed on the lower surface of substrate (56b) (FIG. 4(B)). Openings (64a) of plating resist (64A) are formed larger than via openings (60).

(12) Electrolytic plating is performed under the following conditions to form electrolytic copper-plated film (66) in via openings (60). Accordingly, filled vias (68) are formed (FIG. 4(C)). During that time, the above-described bulging portions are formed in filled vias (68).

[Electrolytic Copper Plating Solution]

| | |
|---|---|
| sulfuric acid | 2.24 mol/l |
| copper sulfate | 0.26 mol/l |
| additive | 19.5 ml/l |
| (Cupracid GL, made by Atotec Japan) | |

[Electrolytic Copper Plating Conditions]

| | |
|---|---|
| current density | 0.55 A/dm$^2$ |
| time | 156 minutes |
| temperature | 22 ± 2° C. |

(13) The bulging portions of filled vias (68) are removed through etching using an etching solution mainly containing copper (II) chloride to level the surfaces of filled vias (68) (FIG. 4(D)).

(14) After plating resists (64A, 64B) are removed using a solution containing 40 g/t of NaOH at a solution temperature of 50° C., transfer bases (34) are removed through soft etching using the above etching solution. Substrate (56b) is cut inside the region having alignment marks (46). Accordingly, printed wiring board (10) is formed (FIG. 4(E)).

(15) On both the upper and lower surfaces of printed wiring board (10), commercially available solder-resist composition (70) is applied to be 20 μm thick. After drying solder-resist composition (70), a 5-mm thick photomask with a pattern corresponding to openings (70a) of solder-resist (70) is adhered to each solder-resist layer (70). Then, solder-resist layers (70) are exposed to ultraviolet rays at 1,000 mJ/cm$^2$, and developed with a DMTG solution. Openings (70a) with a diameter of 200 μm are formed in solder-resist layers (70) (FIG. 5(A)).

Then, solder-resist layers (70) are cured through thermal processing at 80° C. for an hour, at 100° C. for an hour, at 120° C. for an hour and at 150° C. for three hours. Accordingly, solder-resist pattern layers (70) with openings (70a) are formed to be 15-25 μm thick.

(16) Next, printed wiring board (10) with solder-resist layers (70) is immersed for 20 minutes in an electroless nickel plating solution at pH=4.5 containing nickel chloride (2.3× $10^{-1}$ mol/l), sodium hypophosphite (2.8×$10^{-1}$ mol/l) and sodium citrate (1.6×$10^{-1}$ mol/l). Accordingly, 5 μm-thick nickel-plated layer (72) is formed in openings (70a). Furthermore, printed wiring board (10) is immersed at a solution temperature of 80° C. for 7.5 minutes in an electroless gold plating solution containing gold potassium cyanide (7.6×$10^{-3}$ mol/l), ammonium chloride (1.9×$10^{-1}$ mol/l), sodium citrate (1.2×$10^{-1}$ mol/l) and sodium hypophosphite (1.7×$10^{-1}$ mol/l). Accordingly, 0.03 μm-thick gold-plated layer (74) is formed on nickel-plated layer (72) (FIG. 5(B)). Other than nickel-gold layers, a single layer of tin or a noble metal (such as gold, silver, palladium or platinum) may also be formed.

(17) Tin-lead solder paste is printed in openings (70a) of solder-resist layer (70) corresponding to IC chip (90); and tin-antimony solder paste is printed in openings (70a) of solder-resist layer (70) corresponding to daughterboard (94). Then, solder bumps (solder body) (76U, 76D) are formed through a reflow process at 200° C. (FIG. 5(C)).

(18) After inverting the top and bottom of printed wiring board (10), IC chip (90) is mounted on printed wiring board (10) through solder bumps (76U), and printed wiring board (10) is installed on daughterboard (94) through solder bumps (76D) (FIG. 5(D)).

POTENTIAL INDUSTRIAL USE

In the above embodiments, an example of a printed wiring board was shown where conductive circuits are embedded on both surfaces of an insulative resin base material. However, needless to say, a method for forming filled vias in the present invention may also be employed in a multilayer printed wiring board where insulative resin base materials are further laminated on both surfaces of the insulative resin base material with embedded conductive circuits.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
a single insulating layer comprising an insulative resin base material and having a first surface and a second surface opposite the first surface;
first and second conductive circuits embedded in the first surface and the second surface of the insulative resin base material respectively;
a filled via comprising:
an electroless plated film formed on an inner wall of a via opening that reaches from the first surface of the single insulating layer to the second conductive circuit embedded in the second surface of the single insulating layer, and
an electrolytic plated film filled in the via opening having the electroless plated film;
a first solder resist layer formed on the first surface and the first conductive circuit, the first solder resist layer having a first opening which exposes the filled via;
a second solder resist layer formed on the second surface and the second conductive circuit, the second solder resist layer having a second opening which exposes the second conductive circuit which is connected to the filled via;
first solder bump formed on the filled via which is exposed from the first opening in the first solder resist layer; and
second solder bump formed on the second conductor circuit which is exposed from the second opening in the second solder resist layer such that the filled via is sandwiched between the first and second solder bumps.

2. The printed wiring board according to claim 1, wherein the filled via comprises an electroless plated film formed directly on the inner wall of the via opening and an electrolytic plated film formed directly on the electroless plated film.

3. The printed wiring board according to claim 1, wherein the second surface is a surface on which an electronic component is mounted.

4. The printed wiring board according to claim 1, wherein the filled via is filled such that a surface of the electrolytic plated film is on substantially a same level with a planar surface of the electroless plating film.

5. The printed wiring board of claim 1, wherein the first opening partially exposes a top surface of the filled via.

6. The printed wiring board of claim 5, wherein said top surface of the filled via is dented with respect to said first surface of the single insulating layer.

7. The printed wiring board of claim 6, wherein said second surface of the single insulating layer has greater flatness than said first surface single insulating layer.

8. A printed wiring board, comprising:
- a single insulating layer comprising an insulative resin base material and having a first surface and a second surface opposite the first surface;
- first and second conductive circuits embedded in the first surface and the second surface of the insulative resin base material respectively;
- a filled via comprising:
  - an electroless plated film formed on an inner wall of a via opening that reaches from the second surface of the single insulating layer to the first conductive circuit embedded in the first surface of the single insulating layer, and
  - an electrolytic plated film filled in the via opening having the electroless plated film;
- a first solder resist layer formed on the first surface and the first conductive circuit, the first solder resist layer having a first opening which exposes the first conductive circuit which is connected to the filled via;
- a second solder resist layer formed on the second surface and the second conductive circuit, the second solder resist layer having a second opening which exposes the filled via;
- a first solder bump formed on the first conductor circuit which is exposed from the first opening in the first solder resist layer; and
- a second solder bump formed on the filled via which is exposed from the second opening in the second solder resist layer such that the filled via is sandwiched between the first and second solder bumps.

9. The printed wiring board according to claim 8, wherein the filled via comprises an electroless plated film formed directly on the inner wall of the via opening and an electrolytic plated film formed directly on the electroless plated film.

10. The printed wiring board according to claim 8, wherein the second surface is a surface on which an electronic component is mounted.

11. The printed wiring board according to claim 8, wherein the filled via is filled such that a surface of the electrolytic plated film is on substantially a same level with a planar surface of the electroless plating film.

12. The printed wiring board of claim 8, wherein the second opening partially exposes a top surface of the filled via.

13. The printed wiring board of claim 12, wherein said top surface of the filled via is dented with respect to said second surface of the single insulating layer.

14. The printed wiring board of claim 13, wherein said first surface of the single insulating layer has greater flatness than said second surface single insulating layer.

* * * * *